United States Patent
Lin et al.

(10) Patent No.: US 10,347,612 B2
(45) Date of Patent: Jul. 9, 2019

(54) SOLUTION FOR REDUCING POOR CONTACT IN INFO PACKAGE

(71) Applicant: Taiwan Semiconductor Manufacturing Company, Ltd., Hsinchu (TW)

(72) Inventors: Jing-Cheng Lin, Hsinchu (TW); Chen-Hua Yu, Hsinchu (TW); Szu-Wei Lu, Hsinchu (TW); Shih Ting Lin, Taipei (TW); Shin-Puu Jeng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/813,213

(22) Filed: Nov. 15, 2017

(65) Prior Publication Data
US 2018/0096976 A1    Apr. 5, 2018

Related U.S. Application Data

(60) Continuation of application No. 15/054,436, filed on Feb. 26, 2016, now Pat. No. 9,831,224, which is a
(Continued)

(51) Int. Cl.
*H01L 25/10* (2006.01)
*H01L 21/56* (2006.01)
(Continued)

(52) U.S. Cl.
CPC .......... *H01L 25/105* (2013.01); *H01L 21/565* (2013.01); *H01L 21/76802* (2013.01);
(Continued)

(58) Field of Classification Search
CPC ... H01L 25/105; H01L 25/0657; H01L 25/50; H01L 21/565; H01L 21/76802;
(Continued)

(56) References Cited

U.S. PATENT DOCUMENTS 5,634,268 A    6/1997  Dalal et al.
5,804,882 A    9/1998  Tsukagoshi et al.
(Continued)

FOREIGN PATENT DOCUMENTS

CN    1185859 A    6/1998
CN    1359151 A    7/2002
(Continued)

*Primary Examiner* — Armando Rodriguez
(74) *Attorney, Agent, or Firm* — Slater Matsil, LLP (57) ABSTRACT

A package includes a first package including a device die, a molding compound molding the device die therein, a through-via penetrating through the molding compound, and a first plurality of Redistribution Lines (RDLs) and a second plurality of RDLs on opposite sides of the molding compound. The through-via electrically couples one of the first plurality of RDLs to one of the second plurality of RDLs. The package further includes a second package bonded to the first package, a spacer disposed in a gap between the first package and the second package, and a first electrical connector and a second electrical connector on opposite sides of the spacer. The first electrical connector and the second electrically couple the first package to the second package. The spacer is spaced apart from the first electrical connector and the second electrical connector.

20 Claims, 11 Drawing Sheets

Related U.S. Application Data division of application No. 14/449,573, filed on Aug. 1, 2014, now Pat. No. 9,281,297.

(60) Provisional application No. 61/949,843, filed on Mar. 7, 2014.

(51) Int. Cl.

| | |
|---|---|
| *H01L 21/768* | (2006.01) |
| *H01L 21/66* | (2006.01) |
| *H01L 23/31* | (2006.01) |
| *H01L 23/48* | (2006.01) |
| *H01L 23/00* | (2006.01) |
| *H01L 25/065* | (2006.01) |
| *H01L 25/00* | (2006.01) |

(52) U.S. Cl.
CPC ........ *H01L 21/76877* (2013.01); *H01L 22/14* (2013.01); *H01L 23/3107* (2013.01); *H01L 23/481* (2013.01); *H01L 24/09* (2013.01); *H01L 24/17* (2013.01); *H01L 24/19* (2013.01); *H01L 24/20* (2013.01); *H01L 24/81* (2013.01); *H01L 24/97* (2013.01); *H01L 25/0657* (2013.01); *H01L 25/50* (2013.01); *H01L 23/3128* (2013.01); *H01L 24/73* (2013.01); *H01L 2224/023* (2013.01); *H01L 2224/0401* (2013.01); *H01L 2224/04042* (2013.01); *H01L 2224/04105* (2013.01); *H01L 2224/12105* (2013.01); *H01L 2224/13024* (2013.01); *H01L 2224/16227* (2013.01); *H01L 2224/32145* (2013.01); *H01L 2224/32225* (2013.01); *H01L 2224/45015* (2013.01); *H01L 2224/48091* (2013.01); *H01L 2224/48227* (2013.01); *H01L 2224/73265* (2013.01); *H01L 2224/73267* (2013.01); *H01L 2224/81815* (2013.01); *H01L 2224/83* (2013.01); *H01L 2224/97* (2013.01); *H01L 2225/0651* (2013.01); *H01L 2225/06517* (2013.01); *H01L 2225/06548* (2013.01); *H01L 2225/06568* (2013.01); *H01L 2225/1035* (2013.01); *H01L 2225/1041* (2013.01); *H01L 2225/1058* (2013.01); *H01L 2225/1082* (2013.01); *H01L 2924/00014* (2013.01); *H01L 2924/12042* (2013.01); *H01L 2924/15311* (2013.01); *H01L 2924/181* (2013.01); *H01L 2924/3511* (2013.01)

(58) Field of Classification Search
CPC .............. H01L 21/76877; H01L 22/14; H01L 23/3107; H01L 23/481; H01L 24/09; H01L 24/17; H01L 24/19; H01L 24/20; H01L 24/81; H01L 24/97
See application file for complete search history.

(56) References Cited

U.S. PATENT DOCUMENTS

| | | |
|---|---|---|
| 6,333,561 B1 | 12/2001 | Chen |
| 6,555,906 B2 | 4/2003 | Towle et al. |
| 7,619,901 B2 | 11/2009 | Eichelberger et al. |
| 7,863,088 B2 | 1/2011 | Brunnbauer et al. |
| 8,039,303 B2 | 10/2011 | Shim et al. |
| 8,072,059 B2 | 12/2011 | Shim et al. |
| 8,097,490 B1 | 1/2012 | Pagaila et al. |
| 8,133,762 B2 | 3/2012 | Pagaila et al. |
| 8,193,604 B2 | 6/2012 | Lin et al. |
| 8,283,205 B2 | 10/2012 | Pagaila et al. |
| 8,291,584 B2 | 10/2012 | Tanaka |
| 8,319,338 B1 | 11/2012 | Berry et al. |
| 8,330,273 B2 | 12/2012 | Brunnbauer et al. |
| 8,354,304 B2 | 1/2013 | Chow et al. |
| 8,361,842 B2 | 1/2013 | Yu et al. |
| 8,474,133 B2 | 7/2013 | Eichelberger et al. |
| 8,476,824 B2 | 7/2013 | Yu et al. |
| 8,609,465 B2 | 12/2013 | Kawahara |
| 8,680,647 B2 | 3/2014 | Yu et al. |
| 8,703,542 B2 | 4/2014 | Lin et al. |
| 8,741,690 B2 | 6/2014 | Lin et al. |
| 8,742,579 B2 | 6/2014 | Pagaila et al. |
| 8,759,147 B2 | 6/2014 | Choi et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,796,846 B2 | 8/2014 | Lin et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,889,484 B2 | 11/2014 | Chen et al. |
| 8,916,969 B2 | 12/2014 | Chen et al. |
| 8,928,128 B2 | 1/2015 | Karikalan et al. |
| 8,952,521 B2 | 2/2015 | Wojnowski et al. |
| 9,000,583 B2 | 4/2015 | Haba et al. |
| 9,048,222 B2 | 6/2015 | Hung et al. |
| 9,378,982 B2 | 6/2016 | Lin et al. |
| 9,460,987 B2 | 10/2016 | Hung et al. |
| 9,799,631 B2 | 10/2017 | Lin et al. |
| 9,922,903 B2 | 3/2018 | Hung et al. |
| 2005/0277550 A1 | 12/2005 | Brown et al. |
| 2006/0038291 A1 | 2/2006 | Hyun-Soo et al. |
| 2006/0194331 A1 | 8/2006 | Pamula et al. |
| 2007/0227765 A1 | 10/2007 | Sakamoto et al. |
| 2007/0287230 A1 | 12/2007 | Kuramochi et al. |
| 2008/0029886 A1 | 2/2008 | Cotte et al. |
| 2008/0044944 A1 | 2/2008 | Wakisaka et al. |
| 2008/0157330 A1 | 7/2008 | Kroehnert et al. |
| 2009/0008765 A1 | 1/2009 | Yamano et al. |
| 2009/0053858 A1 | 2/2009 | Ko et al. |
| 2009/0236752 A1 | 9/2009 | Lee et al. |
| 2009/0293271 A1 | 12/2009 | Tanaka |
| 2010/0133704 A1 | 6/2010 | Marimuthu et al. |
| 2011/0193216 A1 | 8/2011 | Lin et al. |
| 2011/0291288 A1 | 12/2011 | Wu et al. |
| 2012/0062439 A1 | 3/2012 | Liao et al. |
| 2012/0112355 A1 | 5/2012 | Pagaila et al. |
| 2012/0119378 A1 | 5/2012 | Ng et al. |
| 2012/0199981 A1 | 8/2012 | Jeong et al. |
| 2012/0208319 A1 | 8/2012 | Meyer et al. |
| 2012/0319284 A1 | 12/2012 | Ko et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0105991 A1 | 5/2013 | Gan et al. |
| 2013/0168848 A1 | 7/2013 | Lin et al. |
| 2013/0249101 A1 | 9/2013 | Lin et al. |
| 2013/0270685 A1 | 10/2013 | Yim et al. |
| 2013/0297981 A1 | 11/2013 | Gu et al. |
| 2013/0307140 A1 | 11/2013 | Huang et al. |
| 2013/0328212 A1 | 12/2013 | Chino |
| 2014/0061937 A1 | 3/2014 | Hu et al. |
| 2014/0077394 A1 | 3/2014 | Chang et al. |
| 2014/0110840 A1 | 4/2014 | Wojnowski et al. |
| 2014/0203429 A1 | 7/2014 | Yu et al. |
| 2014/0203443 A1 | 7/2014 | Pagaila et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0255431 A1 | 9/2015 | Su et al. |
| 2015/0255447 A1 | 9/2015 | Hung et al. |
| 2016/0148857 A1 | 5/2016 | Lin et al. |

FOREIGN PATENT DOCUMENTS

| | | |
|---|---|---|
| CN | 1738017 A | 2/2006 |
| CN | 101308803 A | 11/2008 |
| CN | 102576682 A | 7/2012 |
| CN | 102903691 A | 1/2013 |
| CN | 103219307 A | 7/2013 |
| CN | 103325727 A | 9/2013 |

(56) References Cited

FOREIGN PATENT DOCUMENTS

| | | | |
|---|---|---|---|
| CN | 103972191 | A | 8/2014 |
| DE | 10110453 | A1 | 5/2002 |
| DE | 102005040213 | A1 | 3/2006 |
| DE | 102005043557 | A1 | 9/2006 |
| DE | 102011001405 | A1 | 10/2011 |
| JP | 2012199494 | A | 10/2012 |
| KR | 20120077875 | A | 7/2012 |
| KR | 20120101885 | A | 9/2012 |
| KR | 20130035805 | A | 4/2013 |
| KR | 20130052179 | A | 5/2013 |
| KR | 20130116100 | A | 10/2013 |
| KR | 20140043651 | A | 4/2014 |
| TW | 201413882 | A | 4/2014 |
| TW | 201431039 | A | 8/2014 |
| TW | 201436067 | A | 9/2014 |

SOLUTION FOR REDUCING POOR CONTACT IN INFO PACKAGE

PRIORITY CLAIM AND CROSS-REFERENCE

This application is a continuation of U.S. patent application Ser. No. 15/054,436 entitled "Solution For Reducing Poor Contact In Info Packages," filed Feb. 26, 2016 which is a divisional of U.S. patent application Ser. No. 14/449,573 entitled "Solution For Reducing Poor Contact In Info Package," filed Aug. 1, 2014, now U.S. Pat. No. 9,281,297 issued Mar. 8, 2016, which application claims the benefit of U.S. Provisional Application No. 61/949,843, entitled "Semiconductor Package and Methods for Manufacturing and Testing Same," filed on Mar. 7, 2014, which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The variations of the embodiments are discussed. Throughout the various views and illustrative embodiments, like reference numbers are used to designate like elements.

Figure 1:
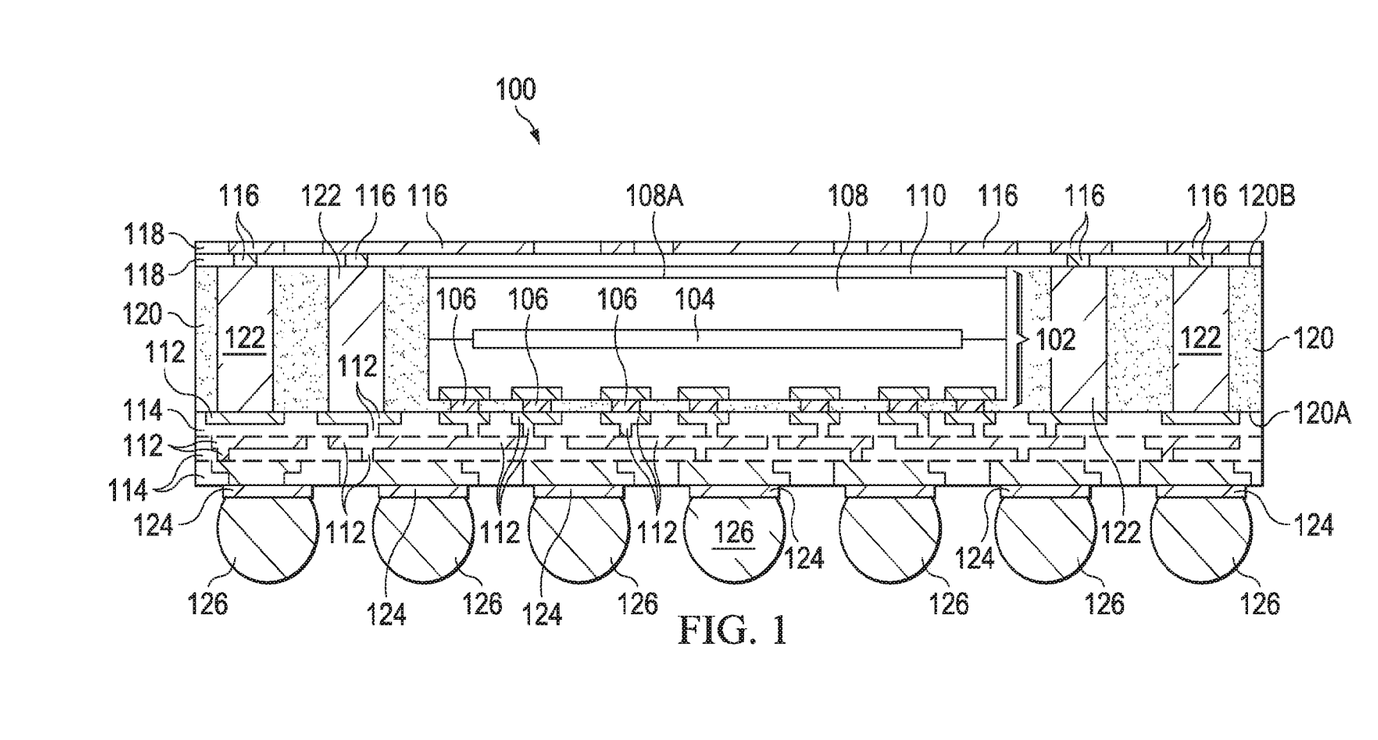
FIGS. 1 through 7 illustrate the cross-sectional views of intermediate stages in the formation of a package including an Integrated Fan-Out (InFO) package in accordance with some embodiments.

FIG. 1 illustrates a cross-sectional view of package 100. In some embodiments, package 100 includes device die 102, with the front side of device die 102 facing down and bonded to Redistribution Lines (RDLs) 112. In alternative embodiments, package 100 includes more than one device die, which may be disposed at the same level. Device die 102 may include semiconductor substrate 108, and integrated circuit devices 104 (such as active devices, which include transistors, for example) at the front surface (the surface facing down) of semiconductor substrate 108. Device die 102 may include a logic die such as a Central Processing Unit (CPU) die, a Graphic Processing Unit (GPU) die, a mobile application die, or the like.

Device die 102 is molded in molding material 120, which surrounds device die 102 when viewed in the top view of the structure in FIG. 1. Molding material 120 may be a molding compound, a molding underfill, a resin, an epoxy, or the like. In accordance with some embodiments, the molding material 120 is formed by applying a non-solid material to encircle device die 102 therein, and then curing the molding material, for example, through a Ultra-Violet (UV) curing or thermal curing, so that the applied non-solid material is solidified. The bottom surface 120A of molding material 120 may be leveled with the bottom ends of device dies 102, which bottom end portions include, for example, metal pillars. The top surface 120B of molding material 120 may be level with or higher than back surface 108A of semiconductor substrate 108. In some embodiments, back surface 108A of semiconductor substrate 108 is overlapped by die-attach film 110, which is a dielectric film adhering device die 102 to the overlying dielectric layer 118. Device die 102 further includes metal pillars/pads 106 (which may include copper pillars, for example) in contact with, and bonded to, RDLs 112.

Package 100 may include bottom-side RDLs 112 underlying device die 102, and top-side RDLs 116 overlying device dies 102. Bottom-side RDLs 112 are formed in dielectric layers 114, and top-side RDLs 116 are formed in dielectric layers 118. RDLs 112 and 116 may be formed of conductive materials such as metallic materials, which may include copper, aluminum, nickel, titanium, alloys thereof, or multi-layers thereof. In some embodiments, dielectric layers 114 and 118 are formed of organic materials such as polymers, which may further include polybenzoxazole (PBO), benzocyclobutene (BCB), polyimide, or the like. In alternative embodiments, dielectric layers 114 and 118 are formed of inorganic material such as silicon oxide, silicon nitride, silicon oxynitride, or the like. Package 100 is referred to as an Integrated Fan-Out (InFO) package since RDLs 112 and 116 extend beyond the edges of device die(s) 102, and the molding of device die(s) 102 is integrated with the formation of the respective RDLs 112 and 116.

Through-Vias 122 are formed to penetrate through molding material 120. In some embodiments, through-vias 122 have top surfaces level with the top surface 120B of molding material 120, and bottom surfaces level with the bottom surface 120A of molding material 120. Through-Vias 122 electrically connect bottom-side RDLs 112 to top-side RDLs 116. Through-Vias 122 may also be in physical contact with bottom-side RDLs 112 and top-side RDLs 116. Through-Vias 122 are formed of a conductive material such as a metallic material, which may include copper, aluminum, tungsten, nickel, titanium, or alloys thereof. The formation of through-vias 122 may include forming a mask layer (such as a photo resist, not shown) over a metal seed layer (not shown), patterning the mask layer to form openings, and plating through-vias 122 in the openings in the mask layer. The mask layer is then removed. In alternative embodiments, through-vias 122 are pre-formed as metal posts, and are placed to the desirable locations.

Electrical connectors 124, which are formed of a non-solder metallic material(s), are formed at the bottom surface of package 100. In some embodiments, electrical connectors 124 include Under-Bump Metallurgies (UBMs) or metal pads. In alternative embodiments, electrical connectors 124 include metal pillars such as copper pillars. Throughout the description, electrical connectors 124 are referred to as metal pads 124, although they may have other forms. In accordance with some embodiments, metal pads 124 comprise copper, aluminum, titanium, nickel, palladium, gold, or multi-layers thereof. In some embodiments, as shown in FIG. 1, the bottom surfaces of metal pads 124 are level with the bottom surface of the bottom dielectric layer 114. In alternative embodiments, the bottom surfaces of metal pads 124 extend below the bottom surface of the bottom dielectric layer 114. In some embodiments, solder regions 126 are attached to the bottom surfaces of metal pads 124.

Figure 2:
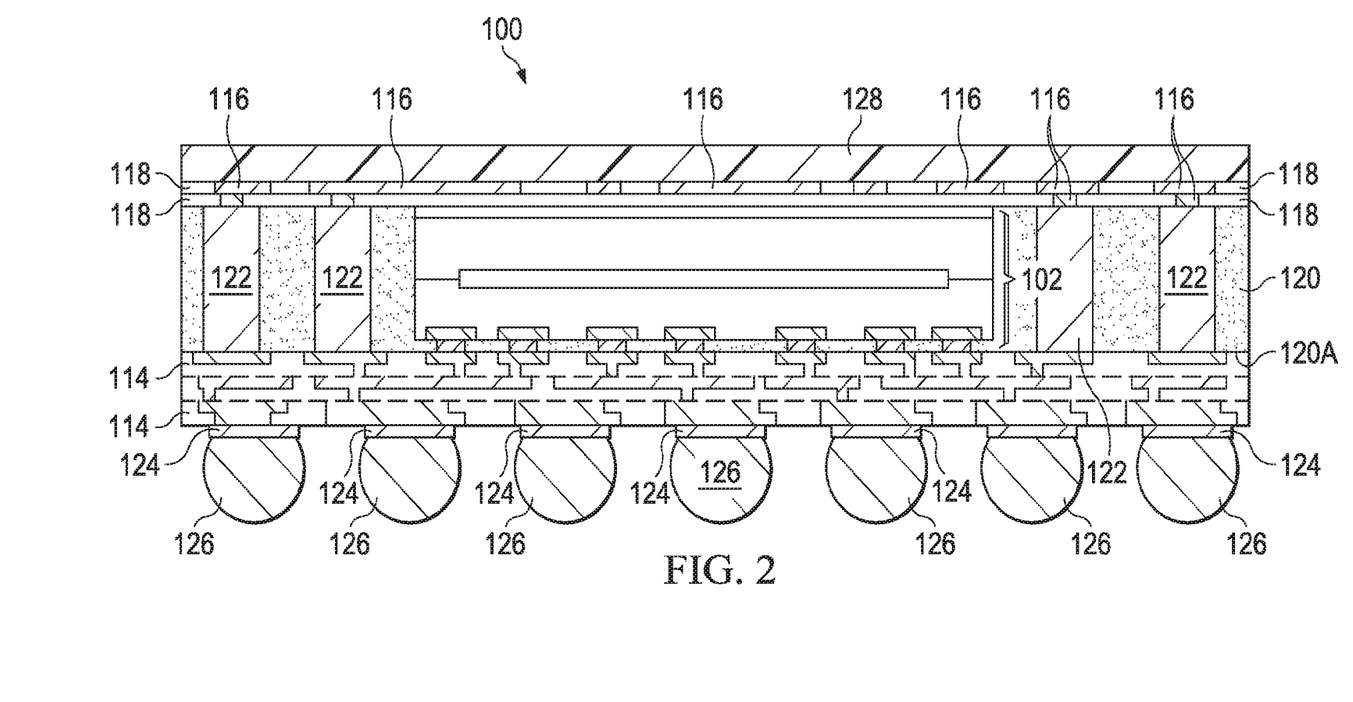

FIG. 2 illustrates the dispose of passivation layer 128, which is used to protect the underlying RDLs 116 from the damage of moisture and other detrimental chemicals. In accordance with some embodiments of the present disclosure, passivation layer 128 comprises a polymer such as PBO or polyimide. Passivation layer may also be formed of solder mask or inorganic materials such as silicon nitride, silicon oxide, or multi layers of the organic and/or inorganic materials. Passivation layer 128 may be formed as a blanket layer covering the entire molding material 120. In accordance with some embodiments, passivation layer 128 is disposed as a liquid or a gel, and is then cured. In alternative embodiments, passivation layer 128 includes a pre-formed film that is placed over the structure shown in FIG. 1.

Figure 3:
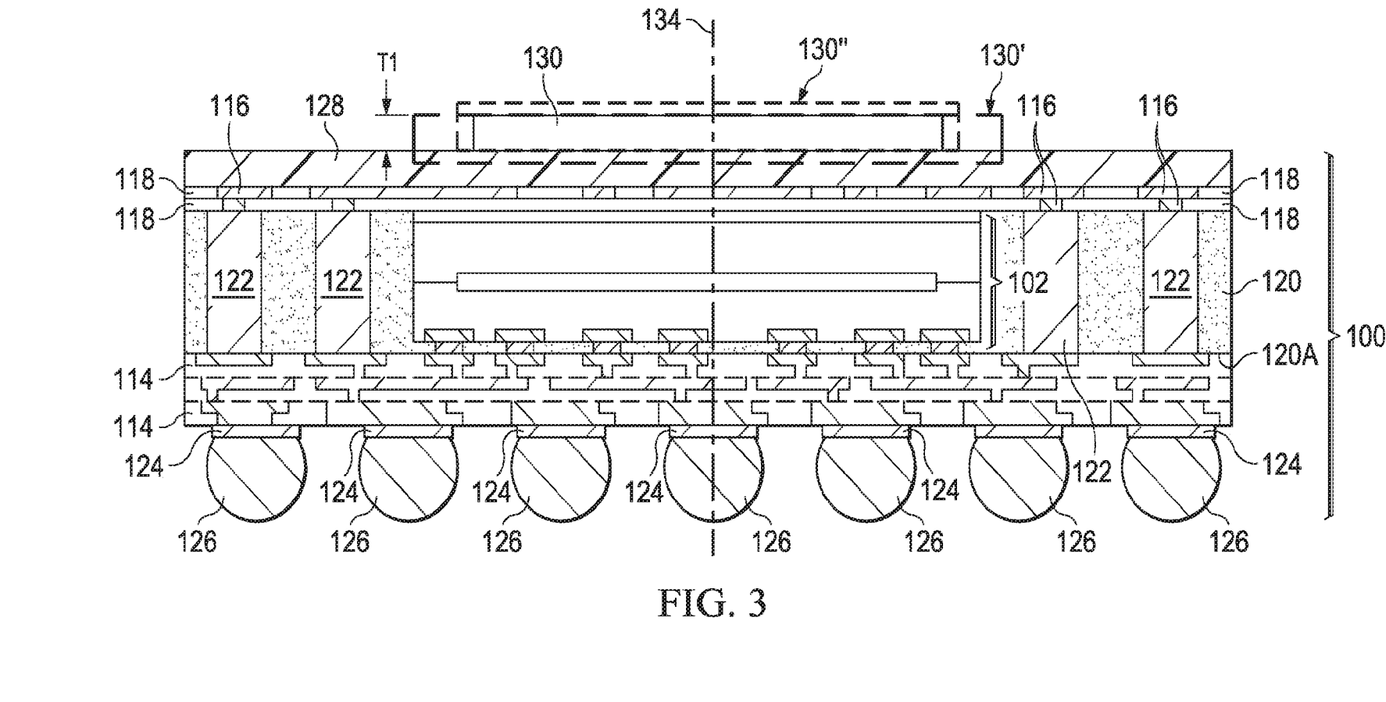

Referring to FIG. 3, spacer 130 is disposed on passivation layer 128. In accordance with some embodiments, spacer 130 is formed of an organic material, which may be dispensed as a non-solid material (liquid or gel). The dispensed organic material is then cured, for example, through Ultra-Violet (UV) curing or thermal curing, to have a solid form. The dispensing of the spacer 130 may be achieved through stencil printing or dispensing through a nozzle. In accordance with some embodiments of the present disclosure, package 100 is a part of a wafer-level package, which includes a plurality of packages having an identical structure as package 100. Accordingly, a plurality of spacers 130 is disposed, with each of the packages having one of the plurality of spacers 130 thereon. In these embodiments, the stencil printing or the nozzle dispensing is performed at the wafer-level, and the plurality of spacers 130 is cured at the same time. Accordingly, the efficiency in the dispensing of spacer 130 is improved due to the increase in the throughput. In alternative embodiments, the formation of spacer 130 is performed after package 100 has been sawed from the respective package that includes multiple identical packages.

In accordance with alternative embodiments of the present disclosure, spacer 130 is pre-formed, and is then mounted and/or adhered onto the top surface of passivation layer 128. The pre-formed spacer 130 may be formed of a material selected from a metal or a metal alloy (such as copper, aluminum, or stainless steel), ceramic, an organic material such as s polymer, a semiconductor material such as silicon, glass, and the like. Spacer 130 may also have a composite structure including more than one layer formed of different ones of the above-mentioned materials. In these embodiments, a bottom portion of the illustrated spacer 130 may include an adhesive material. Spacer 130 is a dummy die in accordance with some embodiments. For example, spacer 130 may be a dummy or an active memory die such as a Dynamic Random Access Memory (DRAM) die. When being the active die, spacer 130 may be flip-bonded to the underlying RDLs.

Figure 10A:
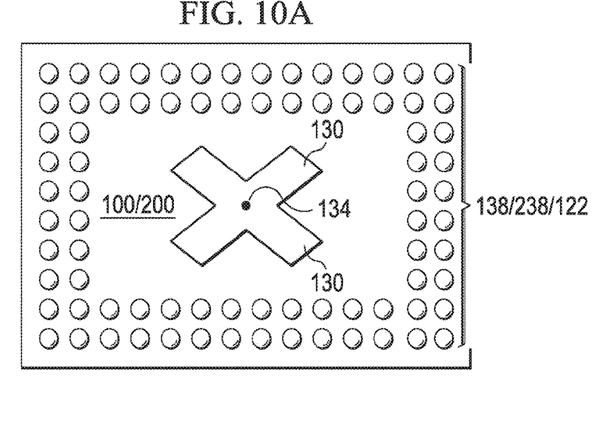
FIGS. 10A through 10F are top/bottom views of the packages in InFO packages in accordance with some embodiments.
Figure 10B:
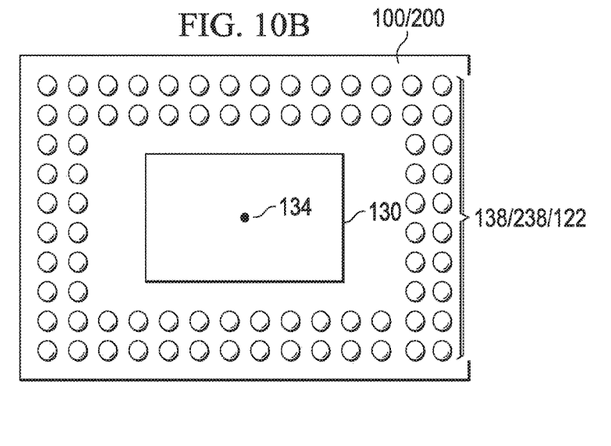

In accordance with some embodiments, spacer 130 includes a portion aligned to the center 134 of package 100, wherein center 134 is drawn to extend in the direction perpendicular to the major planes (such as the top surface and the bottom surface) of package 100. For example, FIGS. 10A through 10F illustrate the top views of spacers 130 in accordance with different embodiments, wherein FIGS. 10A and 10B illustrate that spacer 130 includes a portion overlapping center 134 of package 100. In alternative embodiments, spacer 130 does not include any portion aligned to center 134 of package 100. In these embodiments, as shown in FIGS. 10C, 1D, 10E, and 10F, spacer 130 may include portions on the opposite sides of center 134, and spacer 130 may be symmetric relative to center 134 in accordance with the embodiments of the present disclosure.

Referring back to FIG. 3, spacer 130 has a horizontal size smaller than the respective horizontal size of device die 102, as illustrated in FIG. 3. In alternative embodiments, spacer 130 has a horizontal size equal to (as illustrated by dashed lines 130") the respective horizontal size of device die 102.

In yet alternative embodiments, spacer 130 has a horizontal size greater than (as illustrated by dashed lines 130') the respective horizontal size of device die 102. Spacer 130 may also overlap a part of, or an entirety of, device die 102. As illustrated in FIG. 3, spacer 130 may be aligned to device die 102. In alternative embodiments, spacer 130 is misaligned with the underlying device die 102. In accordance with some embodiments, thickness T1 of spacer 130 is in the range between about 20 µm and about 400 µm. It is appreciated, however, that the values recited throughout the description are merely examples, and may be changed to different values.

Figure 4:
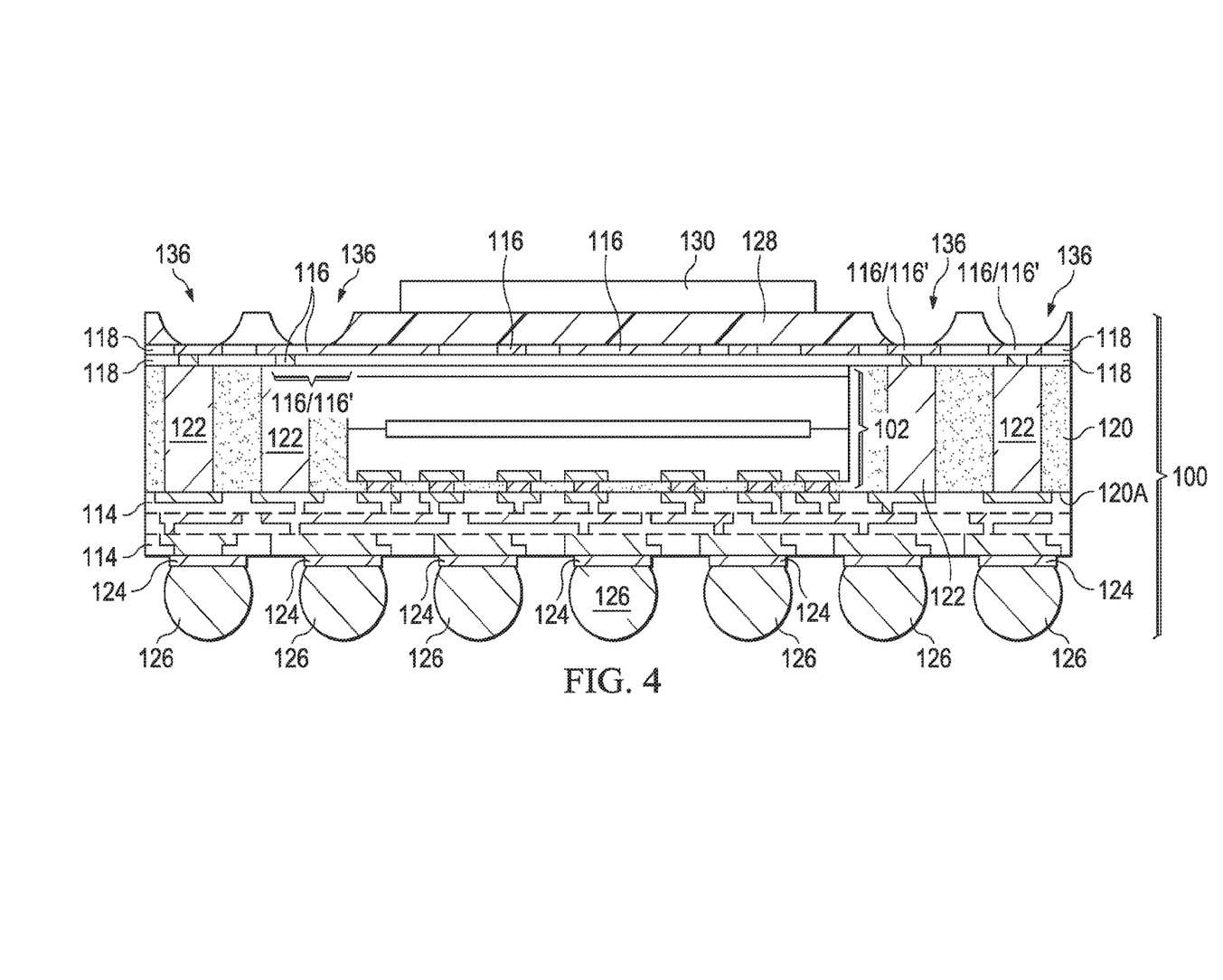

FIG. 4 illustrates the removal of some parts of passivation layer 128 to expose metal pads 116', which may be parts of RDLs 116. As a result, openings 136 are formed in passivation layer 128. The formation of openings 136 may be achieved through laser drill. In some embodiments, as shown in FIG. 4, openings 136 are formed after the formation of spacer 130. In alternative embodiments, openings 136 are formed prior to the formation of spacer 130. Alternatively, when passivation layer 128 is formed of a light-sensitive material such as PBO or polyimide, the formation of openings 136 may be achieved through a lithography process including a light-exposure followed by a development step. In the top view of the structure shown in FIG. 4, openings 136 may be aligned to a ring(s) encircling a center region of passivation layer 128, wherein the center region does not have openings formed therein.

Figure 5:
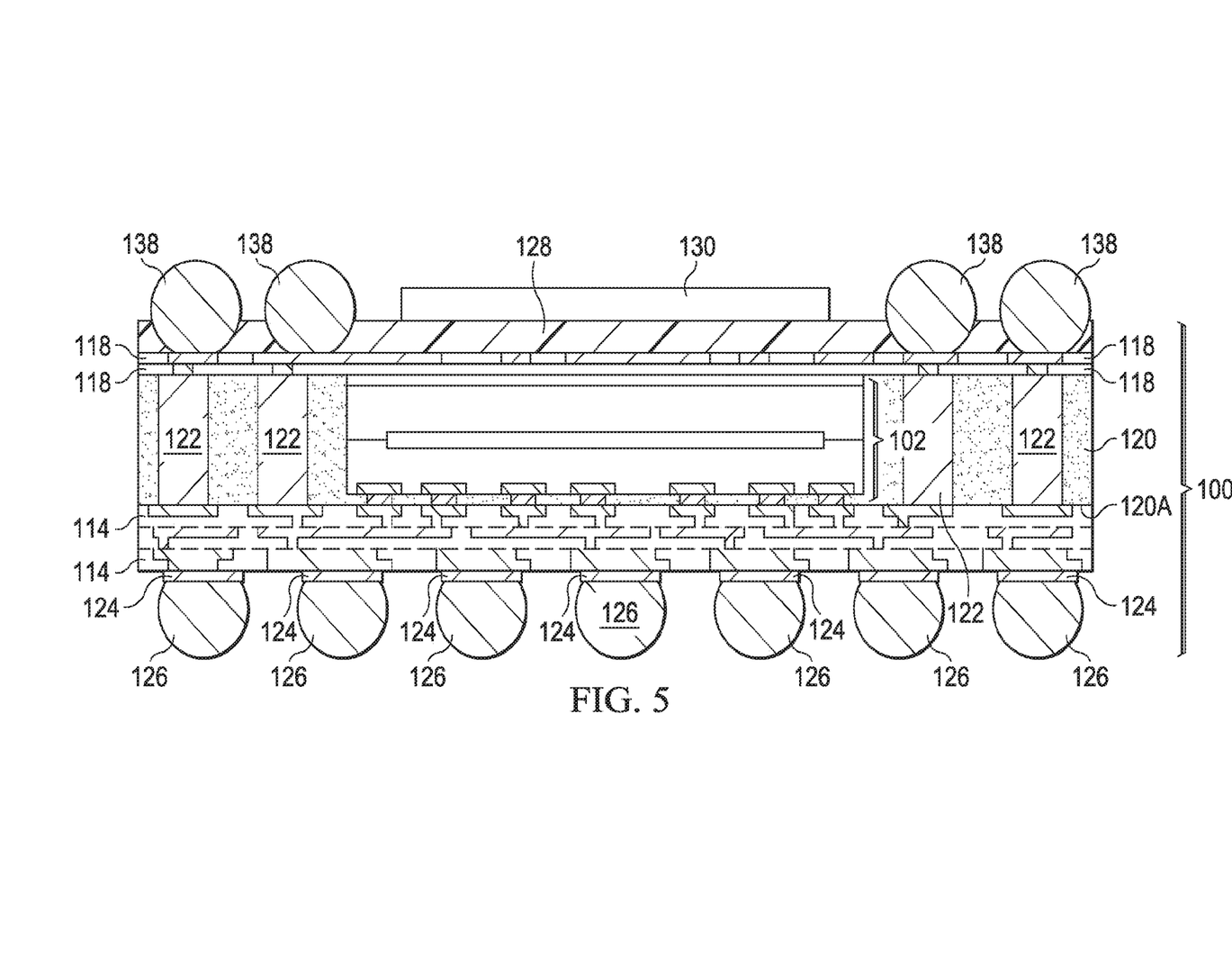

FIG. 5 illustrates the formation of electrical connectors 138. In some embodiments, electrical connectors 138 are solder regions. Accordingly, a ball placement step is performed to drop solder balls in openings 136 (FIG. 4), followed by a reflow process to reflow the solder balls. In alternative embodiments, a solder layer is plated in each of openings 136, and then the solder layers in openings 136 are reflowed to form the solder regions. Electrical connectors 138 may also include metal pillars and solder layers (not shown) on the metal pillars. The metal pillars and the solder layers may also be formed by plating or printing, followed by a reflow to shape the solder layers.

Figure 6:
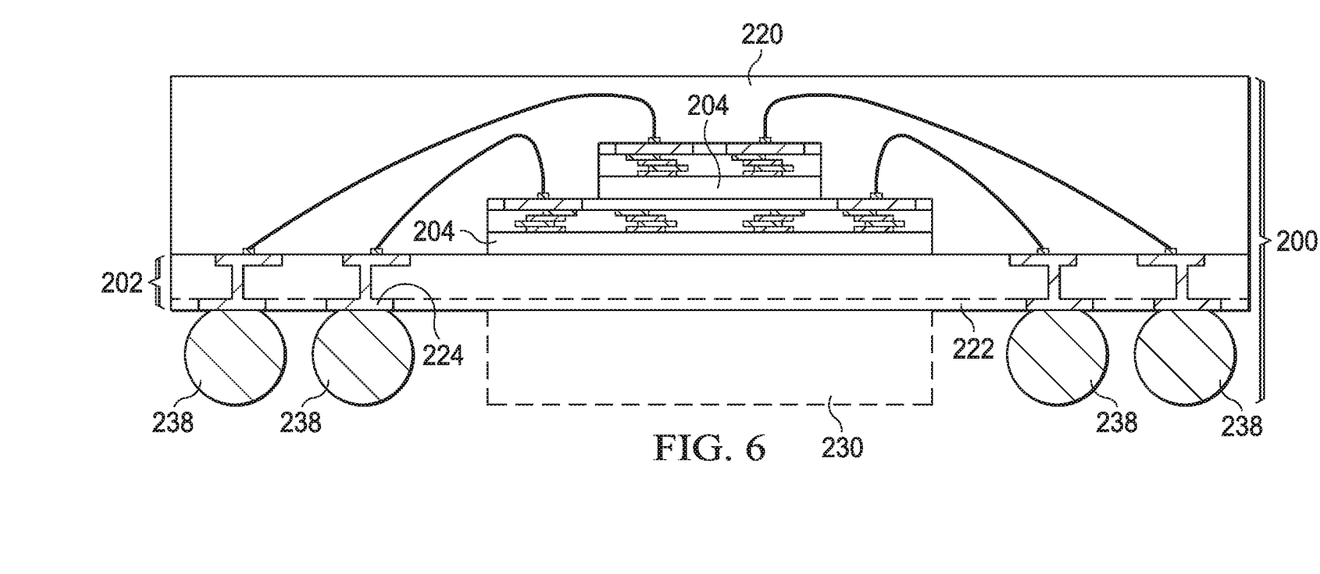

FIG. 6 illustrates a cross-sectional view of package 200, which is to be bonded to package 100. Package 200 is sometimes referred to as a top package. In some embodiments, package 200 includes package substrate 202, and device die(s) 204 bonded to package substrate 202. Package substrate 202 includes conductive pads 224 and surface dielectric layer 222, with conductive pads 224 being in surface dielectric layer 222. Device dies 204 may be memory dies such as Dynamic Random Access Memory (DRAM) dies, Static Random Access Memory (SRAM) dies, or the like. Molding compound 220 may mold device dies 204 therein. Device dies 204 may be identical to each other or may be different from each other in different embodiments. Although FIG. 6 illustrates that device dies 204 are bonded to package substrate 202 through wire-bonding, in alternative embodiments of the present disclosure, flip-chip bonding may be used. Electrical connectors 238 are formed on the surface of package 200. In some embodiments, electrical connectors 238 are solder regions. In alternative embodiments, electrical connectors 238 include metal pillars, metal pads, etc., and a solder layer may, or may not, be formed as the surface components of electrical connectors 238. The locations of electrical connectors 238 are designed according to the locations of electrical connectors 138, so that each of electrical connector 238 may be aligned to one of electrical connector 138, and vice versa.

In accordance with some embodiments of the present disclosure, spacer 230 is disposed on a surface of package 200, and is on the same side of package 200 as electrical connectors 238. In alternative embodiments, spacer 230 is not formed on the surface of package 200. The material and the formation of spacer 230 may be selected from the same candidate materials and the candidate formation methods for forming spacer 130. In addition, spacers 130 and 230 may be formed of the same material, or may be formed of different materials.

Figure 7:
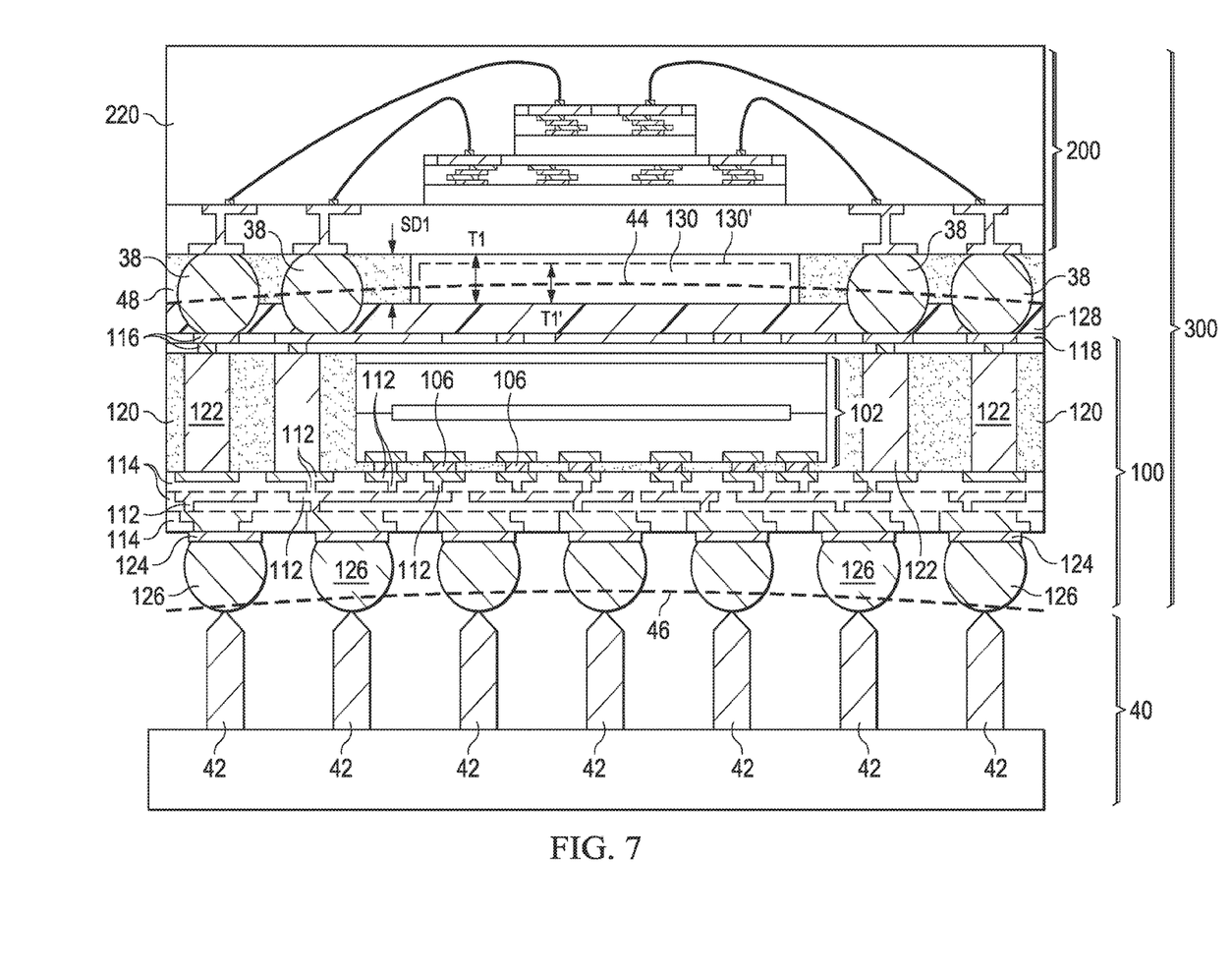

FIG. 7 illustrates the bonding of package 100 with package 200 to form package 300. Package 300 thus has a Package-on-Package (PoP) structure having package 200 as a top package, and InFO package 100 as a bottom package. In the bonding process, electrical connectors 238 (FIG. 6) are aligned to, and are put into contact with, the respective solder regions 138 (FIG. 5). A reflow is then performed to join electrical connectors 238 with electrical connectors 138. FIG. 7 illustrates that when electrical connectors 138 and 238 are solder regions, the reflow causes the merge of electrical connectors 138 with electrical connectors 238 and the formation of solder regions 38.

After the bonding of package 100 with package 200, spacer 130 is located in the gap between packages 100 and 200. In accordance with some embodiments, spacer 130 has its bottom surface attached to package 100, and its top surface in contact with package 200. In these embodiments, thickness T1 of spacer 130 is equal to the standoff distance SD1 between package 100 and 200. In alternative embodiments, spacer 130 has the thickness T1' as shown by the dashed line, which is smaller than the standoff SD1. Accordingly, the bottom surface of spacer 130 is attached to package 100, while the top surface of spacer 130 is spaced apart from the bottom surface of package 200 by a gap in these embodiments.

FIG. 7 further illustrates the functional test of package 300. The functional test is performed through socket 40, which includes a plurality of probe pins 42 pushed against solder regions 126. Through probe pins 42, input signals may be fed into package 300, and output signals may be retrieved from package 300. Socket 40 may include springs (not shown) attached to probe pins 42, so that probe pins 42 may probe solder regions 126 that are not coplanar. The springs, however, also causes forces to be applied on solder regions 126. As shown in FIG. 7, the parameter portions of package 100 are supported by solder regions 38, and the parameter portions of package 100 do not yield to the force applied by probe pins 42. The inner/center portion of package 100 does not have solder regions 38 to support it from the force applied by probe pins 42. If no spacer (such as 130) is formed, the large center space between packages 100 and 200 causes the center part of package 100 to yield to the force applied by probe pins 42. As a result, package 100 warps, and the curved plane of the top surface of the warped package 100 is schematically illustrated as dashed line 44. The bottom points of solder regions 126 will be in a plane that is warped, wherein the plane is illustrated by dashed line 46. Accordingly, some of the probe pins 42 will have poor contact with the corresponding solder regions 126. This may result in some of good packages 300 to wrongfully fail in the functional test.

In the embodiments of the present disclosure, since spacer 130 is formed, spacer 130 supports the center part of package 100, so that the warpage of package 100 caused during the functional test is at least reduced, and possibly eliminated.

Figure 8:
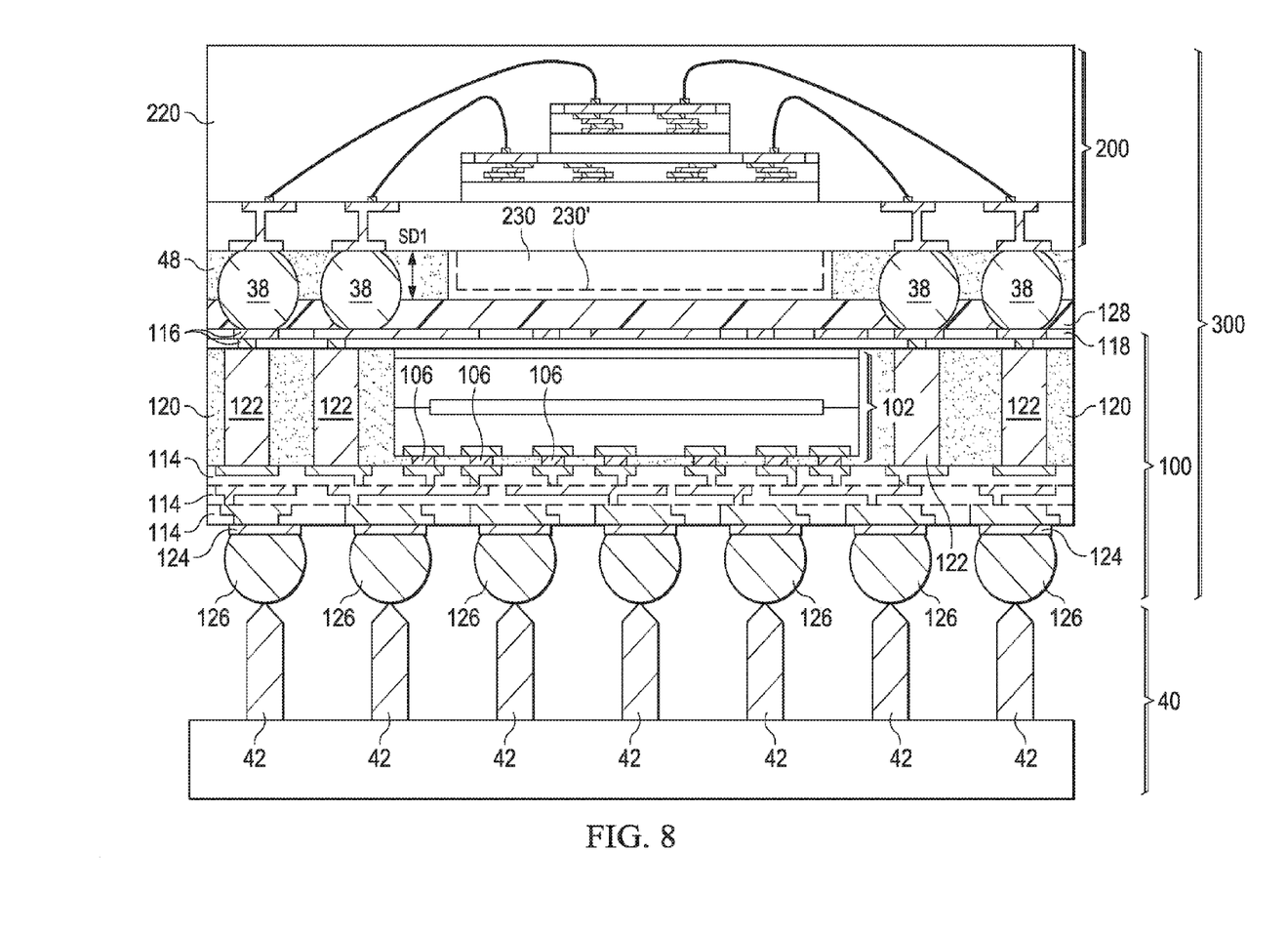
FIGS. 8 and 9 are cross-sectional views of some packages in accordance with some embodiments.
Figure 9:
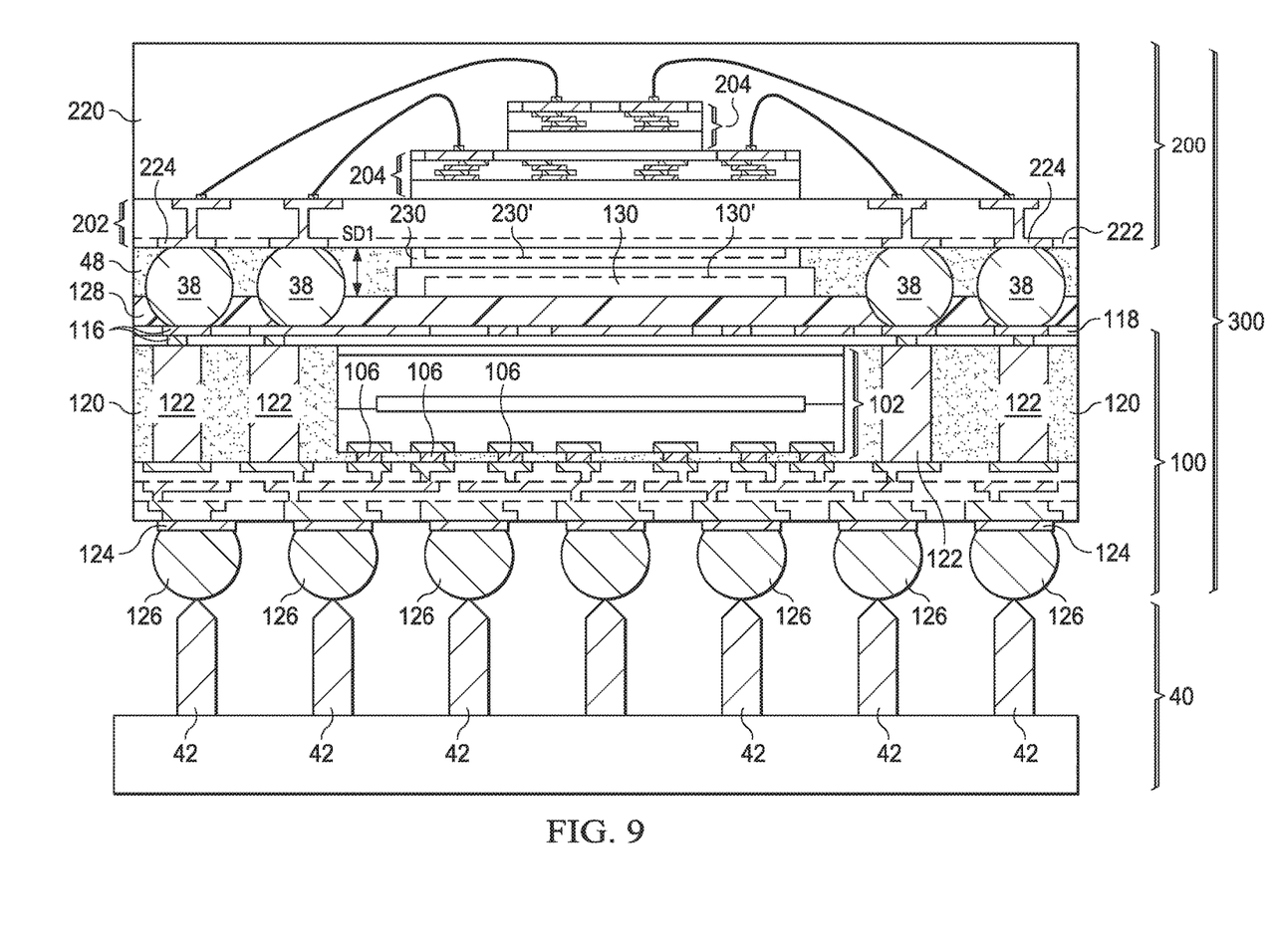

FIGS. 8 and 9 illustrate packages 300 in accordance with alternative embodiments of the present disclosure. The package 300 in FIG. 8 is similar to the package 300 in FIG. 7, except that spacer 230 (rather than 130) is disposed, wherein spacer 230 is disposed in the step as shown in FIG. 6. In these embodiments, spacer 130 is not disposed. Spacer 230 may have a thickness equal to the standoff distance SD1 between packages 100 and 200. Alternatively, spacer 230 is illustrated by dashed lines 230', wherein the respective spacer 230 has a thickness smaller than the standoff distance SD1 between packages 100 and 200. Accordingly, spacer 230 is spaced apart from package 100 in these embodiments.

The package 300 in FIG. 9 is similar to the package 300 in FIG. 7, except that both spacers 130 and 230 are disposed. In these embodiments, spacer 130 may have a same top-view and/or a same size as spacer 230. At least a portion, and possibly an entirety, of spacer 130 is aligned to at least a portion, and possibly an entirety, of spacer 230. Accordingly, in the functional test, at least portion of the spacer 230 supports the respective spacer 130 when package 100 warps under the pressure of probe pins 42. The combined thickness of spacers 130 and 230 may be equal to the standoff distance SD1 between packages 100 and 200. Accordingly, spacers 130 and 230 are in contact with each other. Alternatively, spacers 130 and 230 are illustrated by dashed lines, wherein the combined thickness of spacers 130 and 230 is smaller than the standoff distance SD1 between packages 100 and 200. Accordingly, spacers 130 and 230 are spaced apart from each other by a gap.

In some embodiments, as shown in FIGS. 7, 8, and 9, underfill 48 is dispose in the gap between packages 100 and 200. Accordingly, underfill 48 is in contact with solder regions 38 and spacer(s) 130 and/or 230. In alternative embodiments, no underfill is disposed in the final product, for example, at the time when package 300 is bonded to, for example, a printed circuit board (not shown). Hence, spacer(s) 130 and/or 230 are located in an air gap in these embodiments. Furthermore, in the embodiments in which spacers 130 and 230 are both formed, and have a gap therebetween, underfill 48 may extend into the gap. Furthermore, underfill 48 may contact the surface dielectric layer 222 in package substrate 202, as shown in FIG. 9. In alternative embodiments of the present disclosure, underfill 48 may encircle the gap between spacers 130 and 230 to from an air gap.

FIGS. 10A through 10F illustrate the top views of packages 100 or the bottom views of package 200 in accordance with some embodiments. The reference notation 100/200 indicates that the respective package may be either package 100 or package 200. Electrical connectors 138 or 238 (denoted as 138/238) may be formed adjacent to the parameter areas of the respective packages 100/200. In some embodiments, electrical connectors 138/238 are aligned to a ring(s). An empty space is left in the center region of package 100/200, with spacers 130/230 disposed in the center region. The empty space between neighboring spacers 130/230, however, is controlled not to be too big, so that spacers 130/230 may act as an effective supporter in the functional test.

Figure 10C:
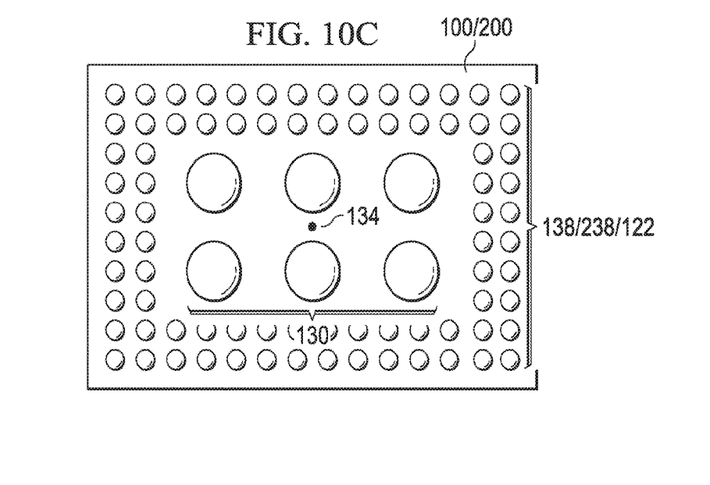
Figure 10D:
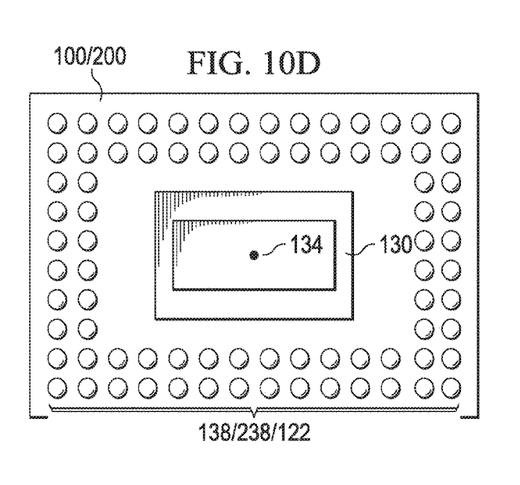
Figure 10E:
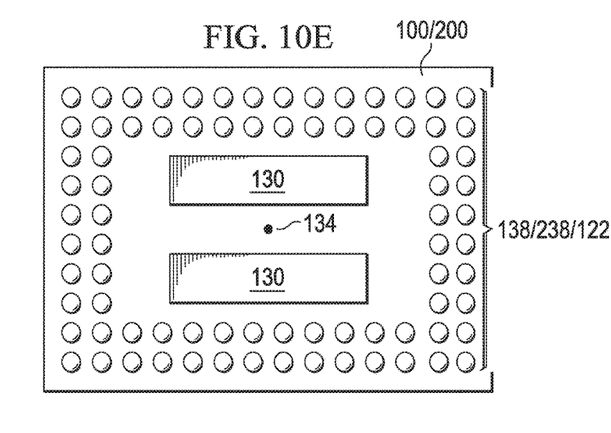
Figure 10F:
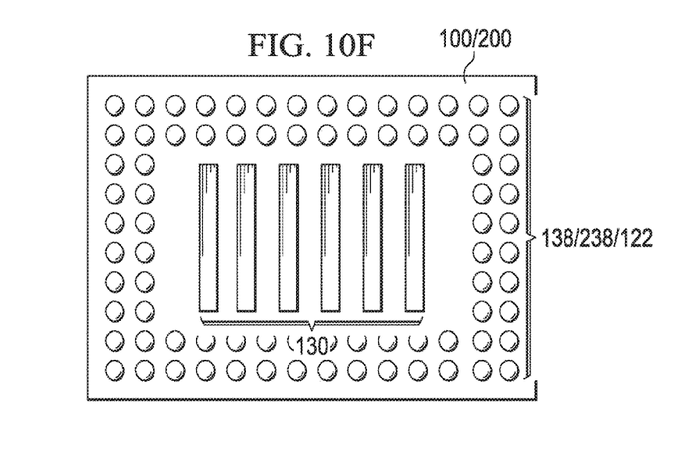

FIG. 10A illustrates that spacers 130 and/or 230 have an X-shaped top-view (or bottom view) shape. FIG. 10B illustrates that spacers 130 and/or 230 have a rectangular top-view (or bottom view) shape. FIG. 10C illustrates that spacers 130 and/or 230 include a plurality of discrete portions that are spaced apart from each other, wherein each of the discrete portions has a circular top-view (or bottom view) shape. FIG. 10D illustrates that spacers 130 and/or 230 form a hollow ring. FIGS. 10E and 10F illustrate that spacers 130 and/or 230 include a plurality of discrete portions that are spaced apart from each other, wherein each of the discrete portions has a strip top-view (or bottom view) shape.

It is appreciated that the desirable size, the desirable position, and the desirable number of spacers 130 and 230 are affected by various factors including, and not limited to, the stiffness of package 100 and the size of the space surrounded by electrical connector 138/238. Hence, the optimum design of spacers 130 and 230 is affected by these factors.

FIGS. 10A through 10F also illustrate some exemplary through-vias 122. Although FIGS. 10A through 10F illustrate that in some exemplary embodiments, through-vias 122 are aligned to solder regions 138/238, through-vias 122 may also be misaligned from solder regions 138/238. Through-vias 122 may also be aligned to a ring(s) that encircle spacer 130/230.

The embodiments of the present disclosure have some advantageous features. By disposing a spacer between an InFO package and another package, the spacer may prevent the InFO package from having warpage during the functional test of the respective InFO package. In addition, by disposing the spacer, the warpage of package 300 is reduced even when it is not in contact with the probe pins used in the function test. For example, sample packages are formed to determine the effect of spacers on the warpage of the packages. The sample packages indicate that the packages not including spacers have the maximum warpage equal to 89 µm, with the average warpage being 63 µm. When the sample packages include the spacers, the maximum warpage is reduced to 67 µm and the average warpage is reduced to 49 µm.

In accordance with some embodiments of the present disclosure, a package includes a first package including a device die, a molding compound molding the device die therein, a through-via penetrating through the molding compound, and a first plurality of RDLs and a second plurality of RDLs on opposite sides of the molding compound. The through-via couples one of the first plurality of RDLs to one of the second plurality of RDLs. The package further includes a second package bonded to the first package, a spacer disposed in a gap between the first package and the second package, and a first electrical connector and a second electrical connector on opposite sides of the spacer. The first electrical connector and the second electrically couple the first package to the second package. The spacer is spaced apart from the first electrical connector and the second electrical connector.

In accordance with alternative embodiments of the present disclosure, a package includes a first package, which includes a device die, a molding compound molding the device die therein, a plurality of through-vias penetrating through the molding compound, a plurality of RDLs underlying, and overlapped by, the device die and the molding compound, and a plurality of solder balls underlying, and electrically coupled to, the plurality of RDLs. The package further includes a second package over the first package. A spacer is disposed in a gap between the first package and the second package. A plurality of solder regions bonds the first package to the second package, wherein the spacer is encircled by the plurality of solder regions.

In accordance with yet alternative embodiments of the present disclosure, a method includes forming a first package, which includes a dielectric layer, a plurality of redistribution lines in the dielectric layer, a device die over and electrically coupled to the plurality of redistribution lines, a molding material molding the device die therein, and a through-via penetrating through the molding material. The method further includes disposing a spacer to attach to a first one of the first package and a second package, and bonding the first package to the second package. The spacer is located between the first package and the second package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first package comprising:
        an encapsulating material; and
        a through-via penetrating through the encapsulating material;
    a second package over and bonded to the first package;
    a first spacer in contact with a top surface of the first package, wherein the first spacer is spaced apart from a bottom surface of the second package; and
    an underfill between the first package and the second package, wherein the underfill contacts opposite sidewalls of the first spacer.

2. The package of claim 1, wherein a portion of the underfill extends into a space between the first spacer and the second package, and the portion of the underfill comprises a top surface contacting the second package, and a bottom surface contacting the first spacer.

3. The package of claim 1 further comprising a second spacer in contact with a bottom surface of the second package.

4. The package of claim 3, wherein a bottom surface of the second spacer contacts a top surface of the first spacer.

5. The package of claim 3, wherein the first spacer is spaced apart from the second spacer.

6. The package of claim 3, wherein the underfill comprises a portion extending between the first spacer and the second package, and the portion of the underfill comprises:
    a top surface contacting the second package;
    a bottom surface contacting the first spacer; and
    a sidewall contacting a sidewall of the second spacer.

7. The package of claim 3, wherein the first spacer and the second spacer are formed of different materials.

8. The package of claim 1 further comprising a plurality of electrical connectors electrically coupling the first package to the second package, wherein the plurality of electrical connectors is aligned to a ring encircling the first spacer.

9. A package comprising:
    a first package comprising:
        an encapsulating material;
        a first die encapsulated in the encapsulating material; and
        a first surface dielectric layer overlapping the first die and the encapsulating material;
    a second package over and bonded to the first package, wherein the second package comprises:
        a second die; and
        a second surface dielectric layer underlying the second die; and
    a first spacer in contact with a bottom surface of the second surface dielectric layer, wherein the first spacer is spaced apart from a top surface of the first surface dielectric layer.

10. The package of claim 9, wherein the first package further comprises a die-attach film contacting a top surface of the first die, wherein the die-attach film is encapsulated in the encapsulating material.

11. The package of claim 9, wherein the second die is a memory die.

12. The package of claim 9 further comprising an underfill between and contacting the first surface dielectric layer and the second surface dielectric layer.

13. The package of claim 9 further comprising a second spacer contacting the first surface dielectric layer, wherein the second spacer is overlapped by the second spacer.

14. The package of claim 13, wherein the first spacer is in contact with the second spacer.

15. The package of claim 13, wherein the first spacer is spaced apart from the second spacer.

16. A package comprising:
    a first spacer;
    a second spacer having at least a portion overlapping a portion of the first spacer;
    an underfill having a first portion encircling both the first spacer and the second spacer;
    a top package comprising a first device die therein; and
    a bottom package comprising a second device die therein, wherein the top package and the bottom package are electrically connected to each other, and are separated from each other by the first spacer, the second spacer, and the underfill.

17. The package of claim 16, wherein the underfill comprises a second portion between the first spacer and the second spacer.

18. The package of claim 17, wherein the second portion of the underfill comprises a top surface contacting the second spacer, and a bottom surface contacting the first spacer.

19. The package of claim 16, wherein the first spacer and the second spacer are in contact with each other.

20. The package of claim 19, wherein the first spacer and the second spacer form a distinguishable interface.

* * * * *